United States Patent
Wu et al.

(10) Patent No.: US 7,473,939 B2
(45) Date of Patent: Jan. 6, 2009

(54) LIGHT-EMITTING DIODE STRUCTURE WITH TRANSPARENT WINDOW COVERING LAYER OF MULTIPLE FILMS

(75) Inventors: Liang-Wen Wu, Taoyuan County (TW); Ya-Ping Tsai, Taoyuan County (TW); Fen-Ren Chien, Taoyuan County (TW)

(73) Assignee: Formosa Epitaxy Incorporation, Taoyuan County (TW)

( * ) Notice: Subject to any disclaimer, the term of this patent is extended or adjusted under 35 U.S.C. 154(b) by 357 days.

(21) Appl. No.: 11/326,314

(22) Filed: Jan. 6, 2006

(65) Prior Publication Data

US 2007/0158667 A1    Jul. 12, 2007

(51) Int. Cl.
*H01L 51/50* (2006.01)

(52) U.S. Cl. .............................. 257/99; 257/89; 257/90; 257/98; 257/100; 257/E33.058; 257/E33.061; 257/E33.064; 257/E33.067

(58) Field of Classification Search ................... 257/89, 257/90, 98, 99, E33.058, E33.061, E33.064, 257/E33.067, 100
See application file for complete search history.

(56) References Cited

U.S. PATENT DOCUMENTS 5,937,274 A * 8/1999 Kondow et al. ............... 438/47
2003/0010989 A1 * 1/2003 Yukimoto .................... 257/88
2004/0169624 A1 * 9/2004 Yamazaki et al. ............. 345/76
2005/0110035 A1 * 5/2005 Chen ........................... 257/99

* cited by examiner

Primary Examiner—Ngan Ngo
Assistant Examiner—Benjamin Tzu-Hung Liu
(74) Attorney, Agent, or Firm—Rosenberg, Klein & Lee

(57) ABSTRACT

A light-emitting diode structure with transparent window covering layer of multiple films includes one (or several) first transparent covering layer(s) and one (or several) second covering layer(s), which are formed on the outside of the light-emitting diode chip. The light-emitting diode chip can emit light in more than two wavelengths to increase the transmission of the different wavelengths and the taking out efficiency of the light-emitting diode. The first transparent covering layer(s) and the second covering layer(s) are deposited each on the other on the outside of the light-emitting diode chip. The surface of the light-emitting diode with the covering layers is smooth. The contacting parts of the first transparent covering layer(s) and the second covering layer(s) are connected by a strong adhesive force and the contacting parts of the covering layer and light-emitting diode chip also are connected by a strong adhesive force.

17 Claims, 5 Drawing Sheets

US 7,473,939 B2

LIGHT-EMITTING DIODE STRUCTURE WITH TRANSPARENT WINDOW COVERING LAYER OF MULTIPLE FILMS

FIELD OF THE INVENTION

The present invention relates to a light-emitting diode and, more particularly, to a light-emitting diode structure with transparent window covering layer of multiple films, which can increase the taking out of the light.

BACKGROUND OF THE INVENTION

The light-emitting diodes of III-V group nitrides were known since 1995. The manufacturing yield and properties have been improved continuously in the recent years. Light-emitting diodes were developed, which lack the blue color of the three primary colors in the visible light spectrum and further the light-emitting diodes were developed which generate white light by mixing colors of generated light wherein the light-emitting diode with the blue light is an important element for the light-emitting diode with white light. Generation of imitated white light produced by mixing blue light with yellow light or the white light produced by mixing red and green light with yellow light is the important application for the light-emitting diodes of III-V group nitrides.

Please refer to the FIG. 1A and FIG. 1B. The common light-emitting diode chip comprises a sapphire substrate 11', a N type BGaN layer 12', an InGaN multiple quantum wells layer 13', P type GaN layer 14', N type electrode 15', P type electrode 16' and a seal and package layer 17'. When the light emits from the InGaN multiple quantum wells layer 13', the light has no specific transmission direction. The light propagates in all directions so only a part of the light will emit from the top of the light-emitting diode chip. Accordingly, common light-emitting diode chips have low taking out efficiency of the light and only up to 50% of the generated light emits from the surface of the light-emitting diode chip. A portion of 50% light will be absorbed by P type electrode 16', to further reduce the light take out. White light is composed of the blue, green and red lights generated in radiating layers of the chip or is produced by adding the fluorescence powder into the radiating layers. At present, only a single seal and package layer is used to seal the light-emitting diode with the white light. Because the blue, green and red light have different transmissions for seal and package layers due to the different refractive indexes thereof, use of a single seal and package layer may reduce the light strength of the mixed blue, green and red lights in the conventional LEDs.

A light-emitting diode structure of III-V group nitrides with light reflection layer of multiple films and the manufacturing method is presented in Taiwan Patent No. 229954 which was filed on 29 Jun. 2004. The patent discloses the light-emitting diode structure of III-V group nitrides with light reflection layer of multiple films, which has a light reflection layer of multiple films deposited each on the other up above the covering layer of N type GaN and below the transparent electric conduction film and formed from two materials having different refractive coefficients. The light reflection layer of multiple films connects with a part of P type electrode, N type electrode and in contact with a layer of N type Ω. The light reflection layer of multiple films is used for covered crystal structure and reflective light.

Accordingly, when red, green and blue lights are mixed to form light-emitting diode with white light, these three wavelengths have different transmissions for the seal and package layer. When the light-emitting diode emits lights of different wavelengths, increase of the taking out efficiency of the light is a very important issue.

SUMMARY OF THE INVENTION

The first object of the present invention is to provide a light-emitting diode structure with transparent window covering layer of multiple films, which comprises at least a first transparent covering layer and a second transparent covering layer. The first transparent covering layer has low refractive index and the second transparent covering layer has high refractive index to increase the light's taking out efficiency of the light-emitting diode.

The second object of the present invention is to provide a light-emitting diode structure with transparent window covering layer of multiple films, which comprises at least a first transparent covering layer and a second transparent covering layer. The both layers can make the light completely transmit and adjust the light color finely.

The third object of the present invention is to provide a light-emitting diode structure with transparent window covering layer of multiple films, which comprises at least a first transparent covering layer and a second transparent covering layer. The first transparent covering layer and the second transparent covering layer are deposited each on the other on the outside of the light-emitting diode chip. The surface of the light-emitting diode structure with transparent window covering layer of multiple films is smooth and stable in the environment. It also doesn't react with oxygen and water in the air.

The fourth object of the present invention is to provide a light-emitting diode structure with transparent window covering layer of multiple films, which comprises at least a first transparent covering layer and a second transparent covering layer. The first transparent covering layer and the second transparent covering layer are deposited each on the other on the outside of the light-emitting diode chip. A strong adhesive force exists between the first transparent covering layer and the second covering layer, as well as between the first transparent covering layer and the substrates, or between the electrode and underlying layer to withstand separating forces.

The various objects and advantages of the present invention will be more readily understood from the following detailed description when read in conjunction with the appended drawing, in which:

DETAILED DESCRIPTION OF THE PREFERRED EMBODIMENT

In the prior art, a transparent film is used to seal and package the light-emitting diode chip. When the light-emitting diode emits light of two wavelengths, the single transparent film has the different transmissions for the different wavelengths. Accordingly, in the light-emitting diode which emits a plurality of wavelengths, the radiation strength is diminished due to different transmission through the single transparent film of the seal and package body.

To obviate the deficiency of the prior art, the present invention provides a light-emitting diode structure capable to increase the taking out efficiency of the light. The light-emitting diode structure is composed of different materials, which have different refractive indexes and are deposited each on the other. The materials are AlN(n=1.9~2.2), $Al_2O_3$ (n=1.63), $BaF_2$(n=1.48), BeO(n=1.82), $CeO_2$(n=2.0~2.4), $In_2O_3$(n=2.0), $TiO_2$(n=2.2~2.5), ZnO(n=2), $ZrO_2$(n=2.05), ZnO(n=2), $SnO_2$(n=2.0) and $SrF_2$.(n=1.44)

Figure 1A:
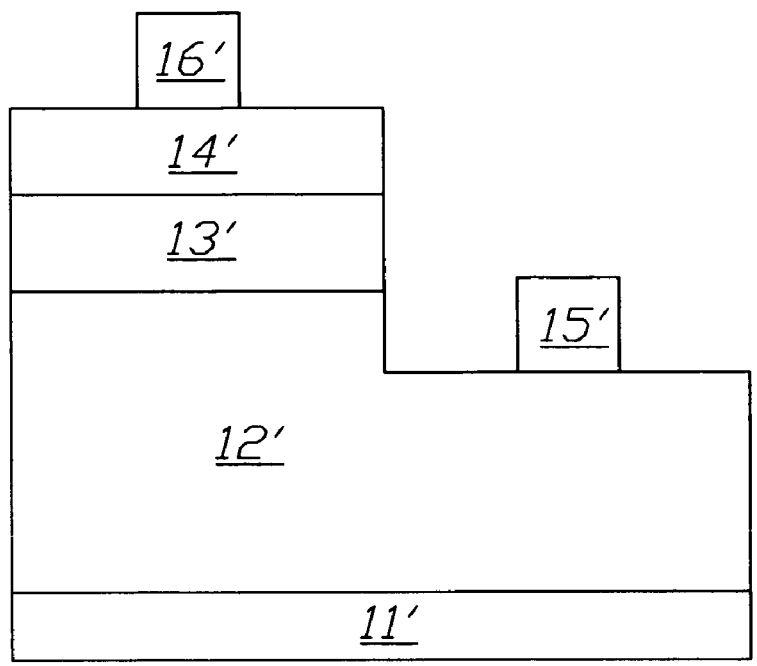
FIG. 1A is a view of the structure of light-emitting diode chip of the prior art.
Figure 1B:
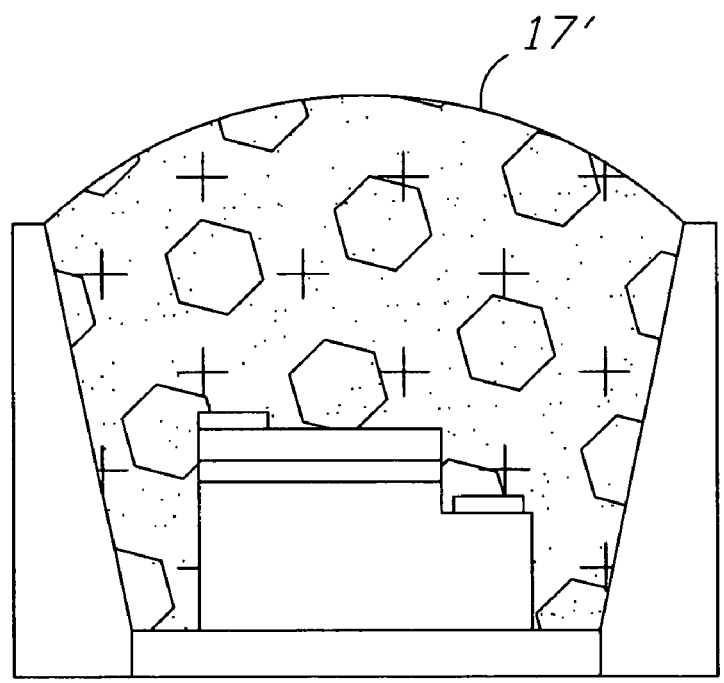
FIG. 1B is a view of the seal and package structure of the light-emitting diode of the prior art.
Figure 1C:
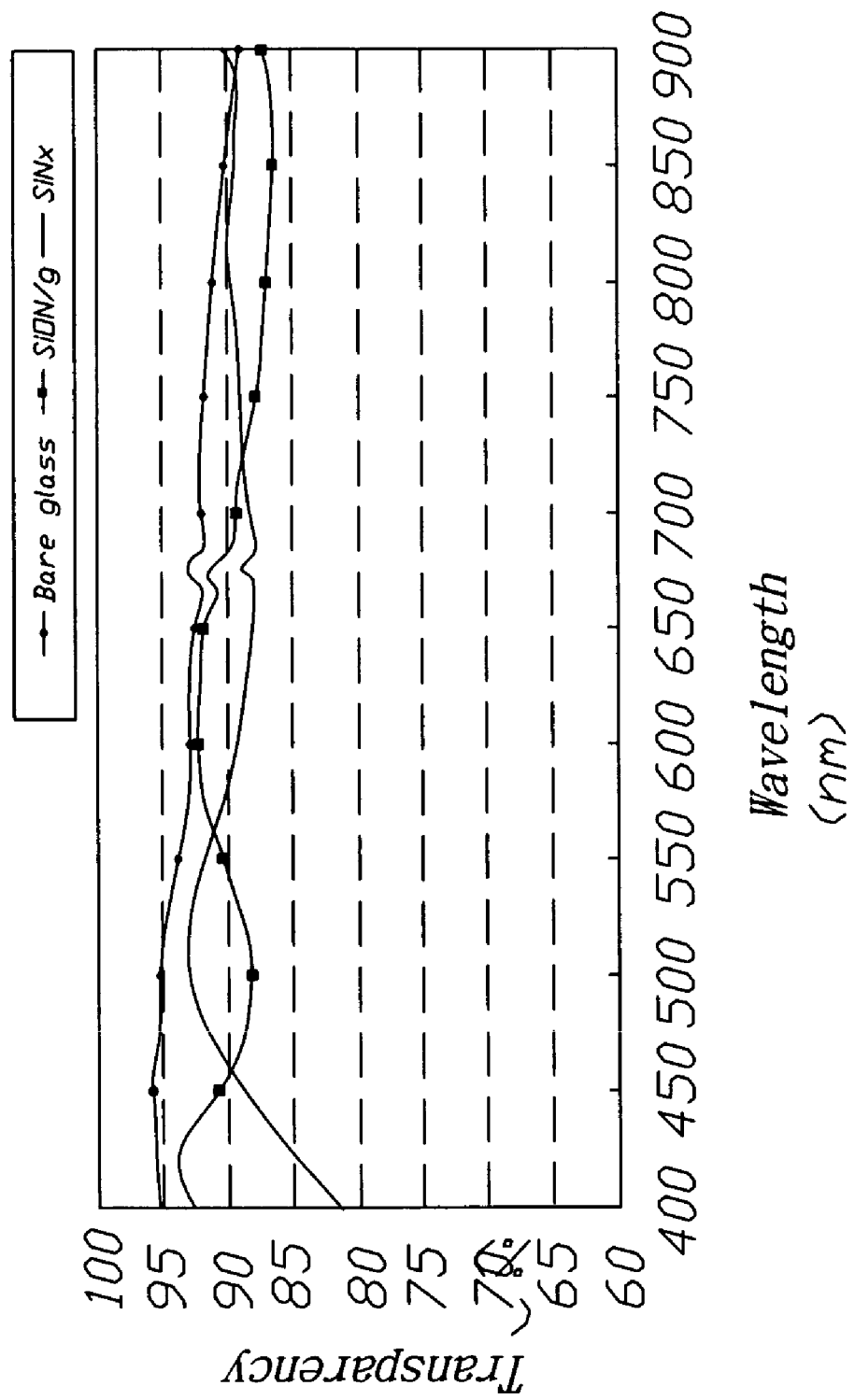
FIG. 1C is a view of the transmissions' graph of the red, green and blue light in accordance with the prior art.
Figure 2:
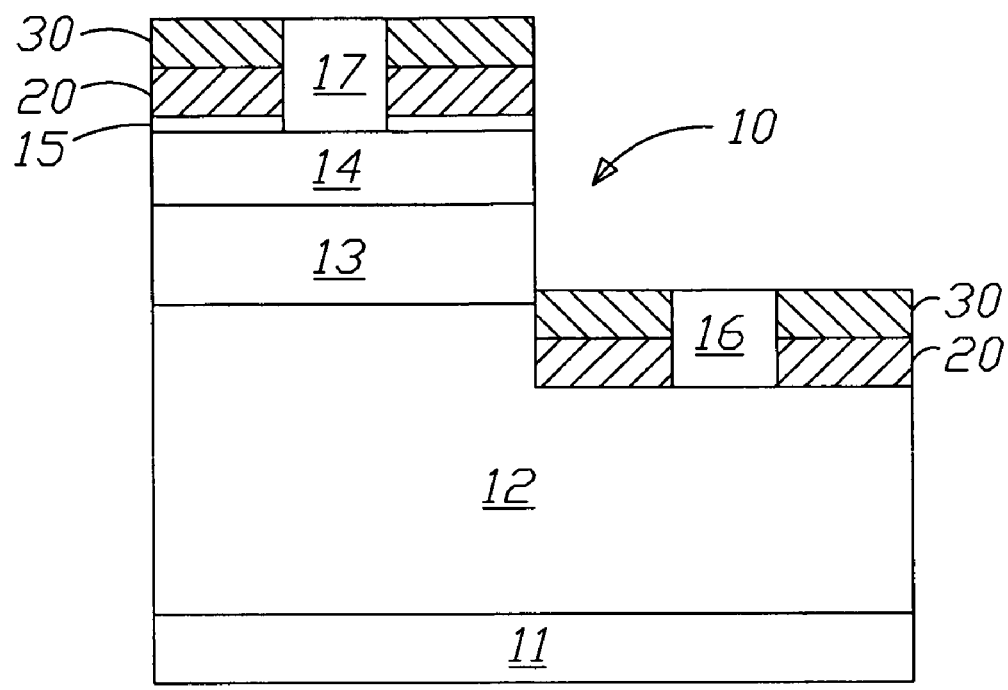
FIG. 2 is a view of the first transparent covering layer and the second transparent covering layer combined with the light-emitting diode chip in accordance with the first embodiment of the present invention.

Please refer to the FIG. 2, which is a view of the structure of the first embodiment in the present invention. The present invention discloses a light-emitting diode structure with transparent window covering layer of multiple films, which comprises a light-emitting diode chip 10, at least a first transparent covering layer 20 and at least a second transparent covering layer 30. The present invention can apply to the light-emitting diode structure of the horizontal type and vertical type electrode. In the first embodiment, we illustrate the light-emitting diode structure of horizontal type electrode.

The light-emitting diode chip 10 comprises a substrate 11, a first semiconductor layer 12, a plurality of active layers 13, a second semiconductor layer 14, a transparent electric conduction layer 15, a first electrode 16 and a second electrode 17, wherein the transparent electric conduction layer 15 is composed of the indium tin oxide (ITO). The first semiconductor layer 12 is a N type semiconductor layer, and the second semiconductor layer 12 is a P type semiconductor layer.

The first semiconductor layer 12 is set on the substrate 11 and the active layer 13 is set on the first semiconductor layer 12. The second semiconductor layer 14 is set on the active layer 13. The transparent electric conduction layer 15 is set on a part of the second semiconductor layer 14. The first electrode 16 is set on the first semiconductor layer 12. The second electrode 17 is set on a part of the second semiconductor layer 14 and a part of the transparent electric conduction layer 15.

Furthermore, outside of the light-emitting diode chip 10 is covered with at least a first transparent covering layer 20 and at least a second transparent covering layer 30 is covered on the first transparent covering layer 20. The first electrode 16 and the second electrode 17 are not covered for electric connection. The first transparent covering layer 20 is composed of amorphous nitrides, which have low refractive indexes. The second transparent covering layer 30 is composed of amorphous $SiO_2$, which has high refractive indexes. The first transparent covering layer 20 and the second transparent covering layer 30 are deposited each on the other on outside of the light-emitting diode chip 10 by chemical vapor deposition (CVD) process.

Figure 3:
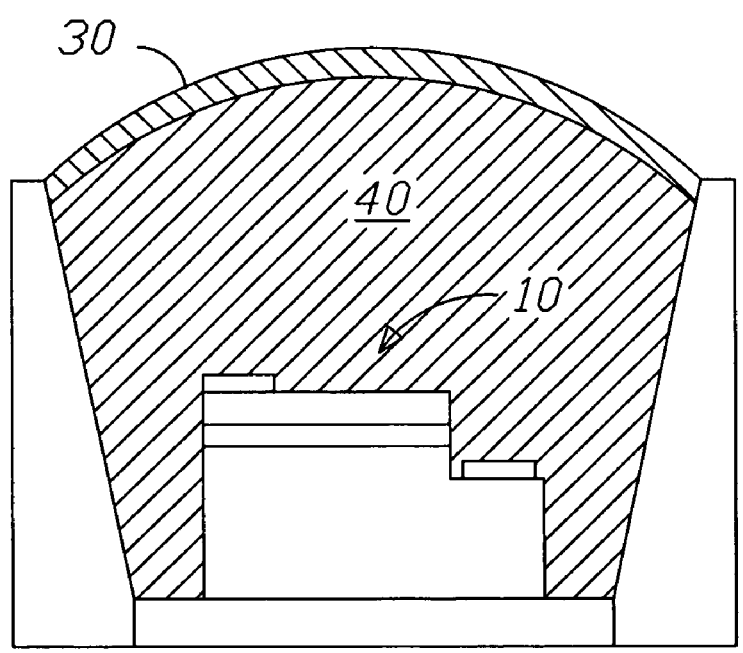
FIG. 3 is a view of the first transparent covering layer and the second transparent covering layer combined with the light-emitting diode chip in accordance with the second embodiment of the present invention.
Figure 3A:
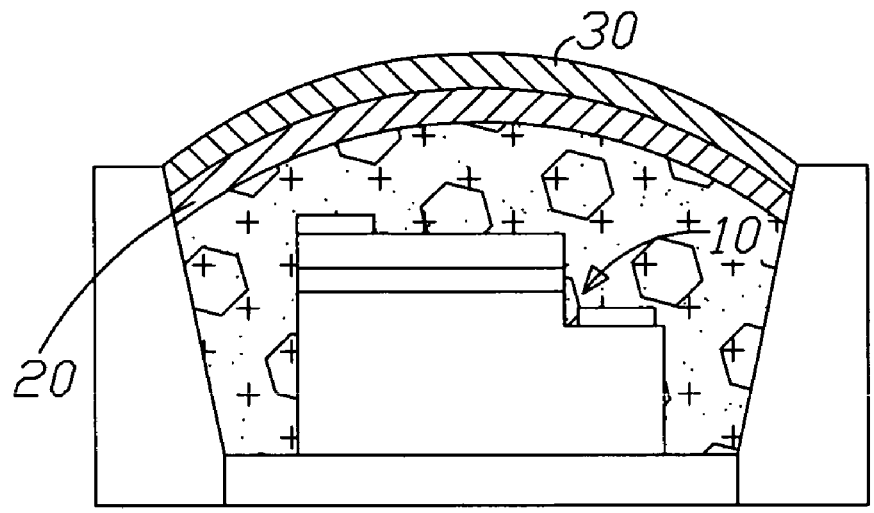
FIG. 3A is a view of the first transparent covering layer and the second transparent covering layer combined with the light-emitting diode chip in accordance with the third embodiment of the present invention.

Please refer to FIG. 3, which is a view of the structure of the second embodiment of the present invention. The light-emitting diode chip 10 can be covered with a seal and package body 40. The seal and package body 40 and the second transparent covering layer 30 have the same materials and at least a second transparent covering layer 30 is covered on the seal and body package 40. Please refer to FIG. 3A. When the light-emitting diode chip 10 emits the light of the single wavelength, the seal and package body 40 covers the outside of the light-emitting diode chip 10. The seal and package body 40 contains at least a fluorescent powder. Accordingly, the light-emitting diode emits the light of two wavelengths light. Further the light-emitting diode chip 10 is covered with the first transparent covering layer 20 and the second transparent covering layer 30.

Figure 3B:
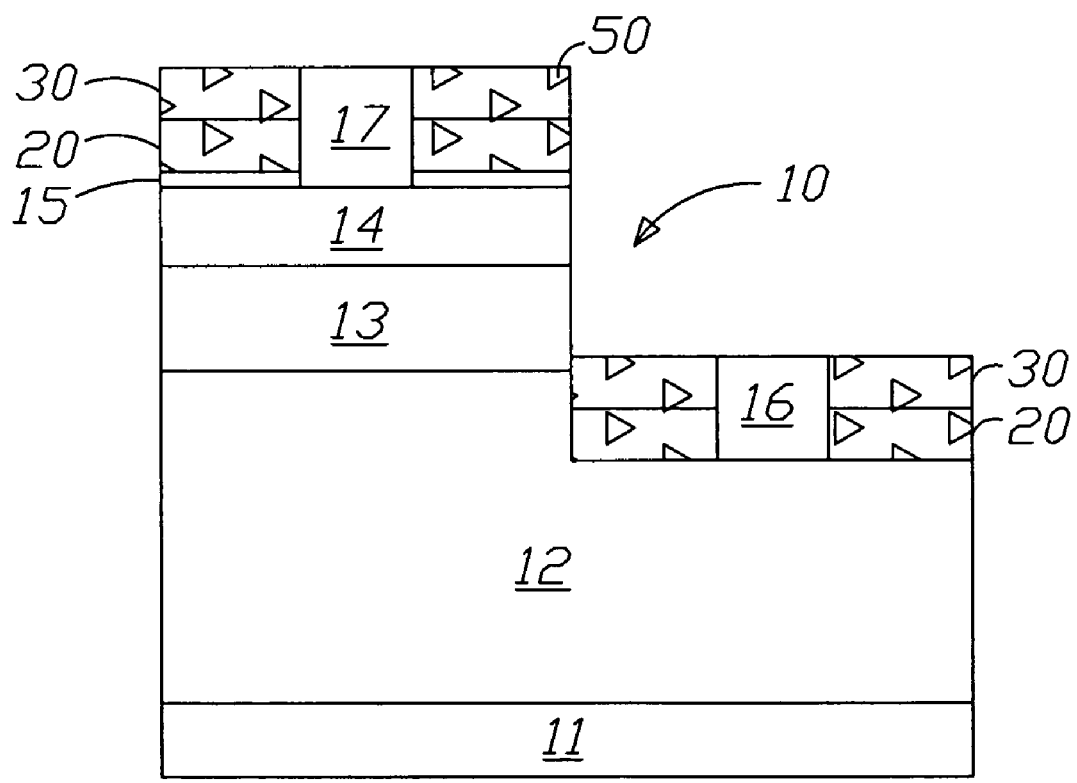
FIG. 3B is a view of the first transparent covering layer and the second transparent covering layer combined with the light-emitting diode chip in accordance with the fourth embodiment of the present invention.

Please refer to the FIG. 3B. When the active layer 13 emits light of a single wavelength or two wavelengths, the first transparent covering layer 20 or/and the second transparent covering layer 30 can be mixed with the fluorescent powder 50.

Results of an experiment conducted are illustrated below:

For the light-emitting diode chip covered with three first transparent covering layers of low refractive index and two second transparent covering layers of high refractive index, the relative data of the light-emitting diode structure obtained for blue light are presented in the following table (reference wavelength is 460 nm, total thickness is 283.14 nm):

|  | Refractive Index | Extinction Coef. | Physical Thickness(nm) |
| --- | --- | --- | --- |
| ITO layer | 2.09200 | 0.02 | — |
| $SiO_2$ | 1.46488 | 0 | 26.31 |
| SiN | 2.06728 | 0.0005 | 16.35 |
| $SiO_2$ | 1.46488 | 0 | 18.77 |
| SiN | 2.06728 | 0.0005 | 22.32 |
| $SiO_2$ | 1.46488 | 0 | 99.39 |
| Air | 1.00000 | 0 | — |

For the light-emitting diode chip covered with three first transparent covering layers of low refractive index and two second transparent covering layers of high refractive index, the relative data of the light-emitting diode structure obtained for green light are presented in the following table (reference wavelength is 520 nm, total thickness is 323.86 nm):

|  | Refractive Index | Extinction Coef. | Physical Thickness(nm) |
| --- | --- | --- | --- |
| ITO layer | 2.05600 | 0.0152 | — |
| $SiO_2$ | 1.46132 | 0 | 29.96 |
| SiN | 2.05861 | 0.00034 | 10.86 |

-continued

|                  | Refractive Index | Extinction Coef. | Physical Thickness(nm) |
|------------------|------------------|------------------|------------------------|
| SiO$_2$          | 1.46132          | 0                | 145.93                 |
| SiN              | 2.05861          | 0.0034           | 33.86                  |
| SiO$_2$          | 1.46132          | 0                | 103.24                 |
| Air              | 1.00000          | 0                | —                      |

For the light-emitting diode chip covered with three first transparent covering layers of low refractive index and two second transparent covering layers of high refractive index, the relative data of the light-emitting diode structure obtained for red light are presented in the following table (reference wavelength is 640 nm, total thickness is 404.70 nm):

|           | Refractive Index | Extinction Coef. | Physical Thickness(nm) |
|-----------|------------------|------------------|------------------------|
| ITO layer | 2.03200          | 0.0112           | —                      |
| SiO2      | 1.45683          | 0                | 49.92                  |
| SiN       | 2.05201          | 0.00008          | 8.62                   |
| SiO2      | 1.45683          | 0                | 169.72                 |
| SiN       | 2.05201          | 0.00008          | 50.01                  |
| SiO2      | 1.45683          | 0                | 125.80                 |
| Air       | 1.00000          | 0                | —                      |

Figure 4A:
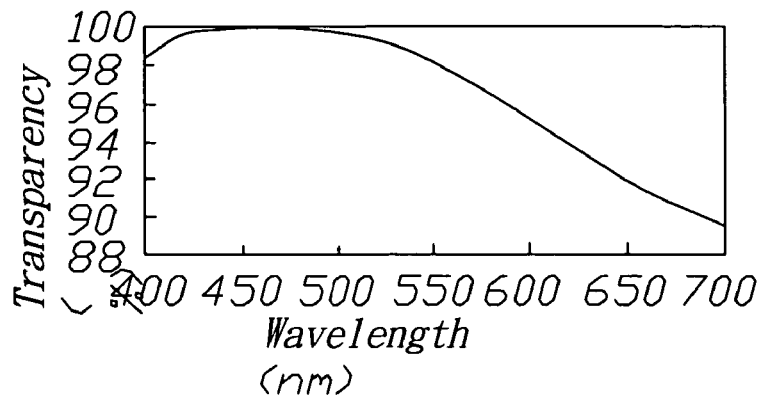
FIG. 4A is a graph of the transmission of the blue light passing through the first transparent covering layer and the second transparent covering layer deposited each on the other to five layers in an alternative embodiment of the present invention.
Figure 4B:
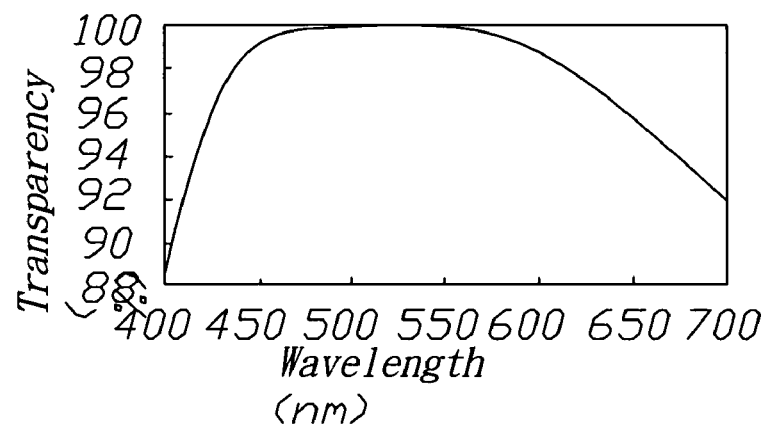
FIG. 4B is a graph of the transmission of the green light passing through the first transparent covering layer and the second transparent covering layer deposited each on the other to form five layers in the alternative embodiment of the present invention.
Figure 4C:
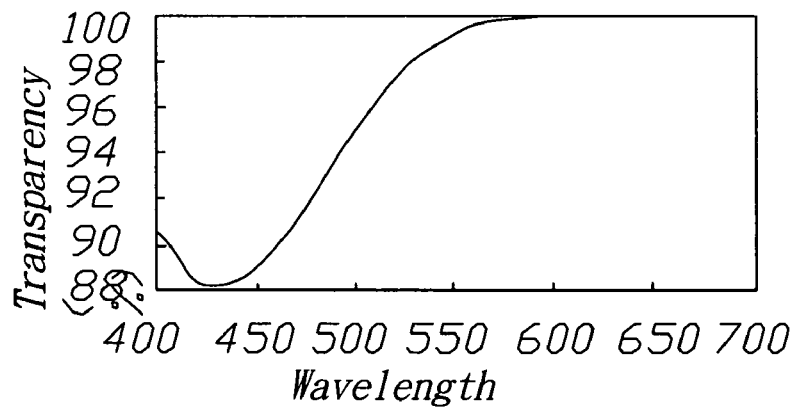
FIG. 4C is a graph of the transmission of the red light passing through the first transparent covering layer and the second transparent covering layer deposited each on the other to form five layers in the alternative embodiment of the present invention.

Please referring the FIG. 4A to FIG. 4C, which are respectively the transmission's graph of the blue, green and red light for three first transparent covering layers of low refractive index and two second transparent covering layers of high refractive index. According to the graphs, the present invention can increase the transmissions of the different wavelengths.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A light-emitting diode structure with transparent window covering layer of multiple films, comprising:
   (a) a light-emitting diode chip, including:
      a substrate;
      a first semiconductor layer positioned on the substrate;
      a plurality of active layers disposed on the first semiconductor layer;
      a second semiconductor layer disposed on the plurality of the active layers;
      a transparent electric conduction layer formed on a portion of the second semiconductor layer;
      a first electrode formed in electrical contact with said first semiconductor layer; and
      a second electrode formed in electrical contact with a portion of the second semiconductor layer and a portion of the transparent electric conduction layer;
   (b) a seal and package body covering the light-emitting diode chip; and
   (c) at least a first and second transparent covering layers positioned on the upper surface of said seal and package body within said transparent window, at least one of said first and second transparent covering layers containing a fluorescent powder; said at least first transparent covering layer having a low refractive index and being positioned in contact with said upper surface of said seal and package body; and
      said at least second transparent covering layer having a high refractive index and being positioned atop said at least first transparent covering layer.

2. The light-emitting diode structure with transparent window covering layer of multiple films as claimed in claim 1, wherein said at least first transparent covering layer is composed of amorphous SiN of low refractive index.

3. The light-emitting diode structure with transparent window covering layer of multiple films as claimed in claim 1, wherein said at least second transparent covering layer is composed of amorphous SiO$_2$ of high refractive index.

4. The light-emitting diode structure with transparent window covering layer of multiple films as claimed in claim 1, wherein the plurality of active layers emit light selected from a group consisting of: blue light, green light, red light, and a random mixture thereof.

5. The light-emitting diode structure with transparent window covering layer of multiple films as claimed in claim 1, wherein said plurality of active layers includes a semiconductor layer of multiple quantum wells.

6. The light-emitting diode structure with transparent window covering layer of multiple films as claimed in claim 1, wherein a thickness of said at least second transparent covering layer is smaller than a thickness of said at least first transparent covering layer.

7. The light-emitting diode structure with transparent window covering layer of multiple films as claimed in claim 1, wherein the transparent electric conduction layer is an ITO layer.

8. The light-emitting diode structure with transparent window covering layer of multiple films as claimed in claim 1, wherein the first semiconductor layer is N type semiconductor layer.

9. The light-emitting diode structure with transparent window covering layer of multiple films as claimed in claim 1, wherein the second semiconductor layer is P type semiconductor layer.

10. The light-emitting diode structure with transparent window covering layer of multiple films as claimed in claim 1, wherein said plurality of active layers emit a light of a single wavelength.

11. The light-emitting diode structure with transparent window covering layer of multiple films as claimed in claim 1, wherein the seal and package body comprises at least a fluorescent powder.

12. A light-emitting diode structure with transparent window covering layer of multiple films, comprising:
   (a) a light-emitting diode chip emitting light of a plurality of wavelengths;
   (b) at least a first transparent covering layer covering at least a portion of the light-emitting diode chip and having a low refractive index; and at least a second transparent covering layer having a high refractive index and covering said at least first transparent covering layer;
   at least one of said at least first and second transparent covering layers containing a fluorescent powder.

13. The light-emitting diode structure with transparent window covering layer of multiple films as claimed in claim 12, wherein said at least first transparent covering layer is composed of amorphous SiN of low refractive index.

14. The light-emitting diode structure with transparent window covering layer of multiple films as claimed in claim 12, wherein said at least second transparent covering layer is composed of amorphous SiO$_2$ of high refractive index.

15. The light-emitting diode structure with transparent window covering layer of multiple films as claimed in claim 12, wherein the light-emitting diode chip comprises at least one active layer emitting light selected from a group consisting of blue light, green light, red light, and a random mixture thereof.

16. The light-emitting diode structure with transparent window covering layer of multiple films as claimed in claim 12, wherein the light-emitting diode chip comprises at least one active layer including a semiconductor layer of the multiple quantum wells.

17. The light-emitting diode structure with transparent window covering layer of multiple films as claimed in claim 12, wherein a thickness of said at least the second transparent covering layer is smaller than a thickness of said at least the first transparent covering layer.

* * * * *